United States Patent [19]

Swirbel et al.

[11] Patent Number: 5,460,922

[45] Date of Patent: Oct. 24, 1995

[54] METHOD FOR FABRICATING ELECTRODE PATTERNS

[75] Inventors: Thomas J. Swirbel, Davie; John K. Arledge, Ft. Lauderdale; James L. Davis, Coral Springs, all of Fla.

[73] Assignee: Motorola, Inc., Schaumburg, Ill.

[21] Appl. No.: 276,147

[22] Filed: Jul. 18, 1994

Related U.S. Application Data

[62] Division of Ser. No. 10,224, Jan. 27, 1993, Pat. No. 5,395,740.

[51] Int. Cl.⁶ .................................. G03F 7/26
[52] U.S. Cl. ................ 430/315; 430/20; 430/313; 430/324; 430/328; 430/329; 430/394; 427/259
[58] Field of Search .................. 430/311, 313, 430/315, 324, 327, 328, 329, 20, 394; 427/164, 250, 255, 259; 156/643, 659.1

[56] References Cited

U.S. PATENT DOCUMENTS

| | | | |
|---|---|---|---|
| 3,982,943 | 9/1976 | Feng et al. | 430/312 |
| 4,004,044 | 1/1977 | Franco et al. | 204/192.32 |
| 4,174,219 | 11/1979 | Andres et al. | 430/321 |
| 4,670,097 | 6/1987 | Abdalla et al. | 156/659.1 |
| 4,827,326 | 5/1989 | Altman et al. | 257/759 |
| 5,121,237 | 6/1992 | Ikeda | 359/67 |

FOREIGN PATENT DOCUMENTS 53-053342  5/1978  Japan ..................... 430/315

OTHER PUBLICATIONS

IBM Technical Disclosure Bulletin, Fredericks, et al., titled "Polysulfone Lift–Off Masking Technique," IBM Corp., vol. 20, No. 3, Aug., 1977.

IBM Technical Disclosure Bulletin, Dalal, et al., titled "Chrome–Copper–Chrome Lift–Off Process," IBM Corp., vol. 20, No. 38 Jan., 1978.

*Primary Examiner*—Kathleen Duda
*Attorney, Agent, or Firm*—Dale W. Dorinski

[57] ABSTRACT

A method of forming electrode patterns on a substrate. A substrate (30) is patterned with a photoresist layer (14) on the front side so that portions (18) of the substrate are revealed. A metal oxide layer (32) is deposited on the patterned photoresist layer and the revealed portions of the substrate. The patterned photoresist layer is then flood exposed to actinic radiation (19). The photoresist pattern (20) is removed, carrying with it those portions of the metal oxide layer deposited on the photoresist layer, forming an electrode pattern (22) by a lift-off technique.

12 Claims, 1 Drawing Sheet

METHOD FOR FABRICATING ELECTRODE PATTERNS

CROSS REFERENCE TO RELATED APPLICATIONS

This application is a divisional of U.S. patent application Ser. No. 08/010,224 filed Jan. 27, 1993 now U.S. Pat. No. 5,395,740, assigned to Motorola, Inc., which is related to Ser. No. 08/010,223 filed Jan. 27, 1993, also assigned to Motorola, Inc. and now abandoned.

TECHNICAL FIELD

The present invention relates, in general, to the fabrication of electrode layers in a thin film device and, more particularly, to fabricating transparent electrode layers for use in electroluminescent displays, such as liquid crystal displays.

BACKGROUND

Liquid crystal displays are generally formed of two panels, each having a transparent electrode pattern. The function of the pattern on the panels is to apply an electrical field across a liquid crystal fluid residing in a gap between the panels, thereby causing a change in the optical properties of the liquid crystal. One or both of the panels is typically transparent in order that a change in the liquid crystal might be viewed by a user. Each panel is connected to a suitable voltage source. The voltage source powers the elements that have been patterned on one or both of the panels in order to provide the display, with the elements of pattern in a shape corresponding to the information that is to be displayed. For example, the pattern may represent the outline of a variety of letters, numbers, or symbols.

The elements in the pattern typically are formed from a material such as indium-tin oxide (ITO). The elements are then connected to the voltage source by a conductive metal bus system. These electrodes are usually prepared by first coating one surface of a substrate by vacuum deposition of the ITO. Portions of the ITO are then selectively removed by etching in order to produce the desired electrode pattern. In order to confine the etching to selected areas, the ITO layer is covered with a photoresist or layer of photopolymerizable material. The photoresist is then polymerized in the desired image by exposure to radiation, such as ultraviolet light. The unpolymerized resist in the unexposed area is then removed by a suitable solvent in order to form windows in the resist. The uncovered areas of the ITO layer are then etched away with appropriate solvents such as acids, in order to create the pattern. The remaining portions of the photoresist layer are then stripped off, leaving the substrate with the desired electrode pattern formed thereon.

While this method of photoetching patterns makes it possible to prepare very complex patterns having very fine lines, aggressive acids are required to etch the ITO. These acids can attack some substrates, such as plastics. Prior art solutions to avoid this problem have included lift-off methods in which a photoresist is applied and imaged directly on the substrate. The metal film is then deposited on the resist and the substrate, and when the resist is stripped away, it takes the unwanted portions of the metal film with it. Conductor resolution is defined solely by the lithography of the resist. One problem with conventional lift-off techniques is that they use aggressive stripping solutions to remove the polymerized resist, which may be harmful to plastic substrates used in flexible displays.

Therefore, a need has continued to exist for a method of producing electrode patterns on a substrate which avoid the problems introduced by known and conventional methods of the art.

SUMMARY OF THE INVENTION

Briefly, according to the invention, there is provided a method of forming electrode patterns on a substrate. A lift-off method for forming electrode patterns on a substrate comprises providing a substrate having a patterned photoresist layer on a first major surface. Portions of the first major surface are revealed by the resist pattern. A transparent coating layer is deposited on the patterned photoresist layer and the revealed portions of the substrate. The patterned photoresist layer is exposed to actinic radiation, such as ultraviolet light, through the transparent coating layer. The photoresist layer is removed, carrying with it those portions of the coating layer deposited on the photoresist layer, forming an electrode pattern.

DETAILED DESCRIPTION OF THE PREFERRED EMBODIMENT

Figure 1:
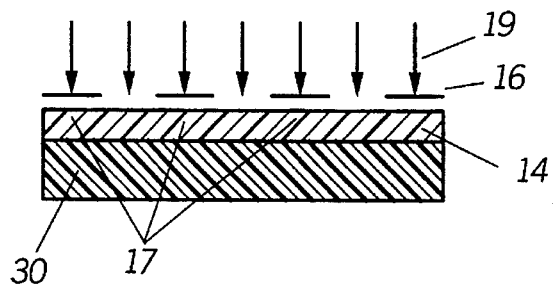
FIGS. 1 through 5 are cross-sectional illustrations that represent steps of the process for fabricating electrode patterns on a substrate in accordance with the invention.

While the specification concludes with claims defining the features of the invention that are regarded as novel, it is believed that the invention will be better understood from a consideration of the following description in conjunction with the drawing figures, where reference numerals denoting the same elements are carried forward. The steps used to carry out the methods of the instant invention are now shown schematically in FIGS. 1–5. Referring now to FIG. 1, an opaque substrate 30 is used as the base or support for the electrodes to be patterned. Plastic substrates, such as a polyester, polyethersulfone, polycarbonate, or polyetherimide, are particularly preferred for flexible displays. A photoresist layer 14 is applied to the substrate. The photoresist is typically a positive acting resist. A mask 16 is then applied over the photoresist layer 14 in order to selectively cover portions 17 of the photoresist layer. The assembly is then exposed to actinic radiation, typically ultraviolet light 19. The ultraviolet light 19 initiates a chemical reaction in the photoresist layer 14, which causes the exposed portions of the photoresist layer to become depolymerized or broken down, rendering them more soluble in selected chemicals.

Figure 2:
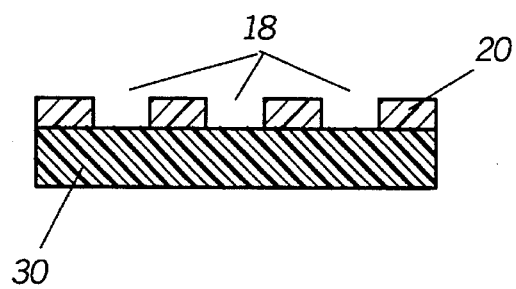

Referring now to FIG. 2, the photoresist layer is developed by conventional means, for example, in solvents or aqueous solutions in order to remove the depolymerized portions 18 of the resist, creating a pattern 20. The unexposed portions comprise the pattern 20, which remains after development of the photoresist layer 14. The pattern 20 now covers only certain areas of the substrate, leaving other portions 18 of the front side of the substrate revealed.

Figure 3:
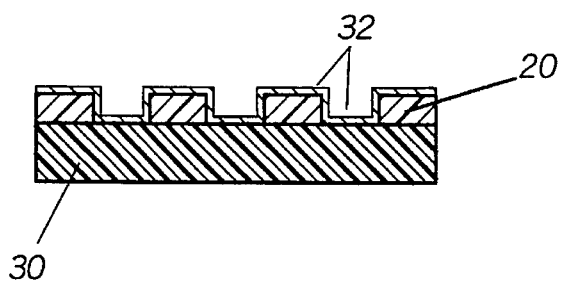

Referring now to FIG. 3, a transparent coating, for example, a metal oxide layer 32, is then deposited on the photoresist pattern 20 and the revealed portions of the substrate 30. Other transparent coatings, such as metal nitrides or metal sulfides, may also be employed. The layer 32 is very thin as compared to the thickness of the substrate 30 and, for purposes of illustration, is intentionally shown in exaggerated scale in the drawing figures. The metal oxide layer 32 preferably comprises an indium-tin oxide (ITO)

which may be applied by conventional vacuum deposition processes such as sputtering. In the sputtering technique, one or more targets formed from the materials to be deposited, for example, indium and/or tin are bombarded by inert gas ions, for example, argon, causing the metal atoms to be deposited on the substrate. In order to generate effective sputtering rates, a glow discharge of plasma is required in the sputtering system. Various types of sputtering processes known to those skilled in the art may be used, such as DC magnetron, RF, or bias sputtering. In the present invention, the preferred technique is to provide a reactive sputtering condition with a gas, in this case oxygen, introduced into the vacuum chamber so that an oxide of the target material will be deposited on the substrate. During the sputtering process, the pure metal(s) is converted to metal oxide(s) and deposited directly on the substrate and the photoresist pattern 20. Other metals such as aluminum, chrome, nickel, tin, indium, zinc, or tantalum may be used singly, or in combination. The key requirement is that the deposited layer 32 be transparent to ultraviolet or visible light.

Figure 4:
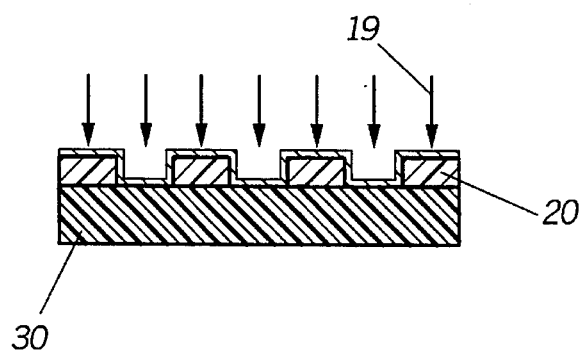

Turning now to FIG. 4, the photoresist pattern 20 is now completely depolymerized by flood exposing it to, for example, ultraviolet light 19. This is easily accomplished in the present invention by transmitting the light through the transparent metal oxide layer 32. Since the metal oxide layer 32 is transparent, this does not pose a problem. As in the initial exposure step, the light 19 causes a chemical reaction in the resist 20, rendering it more soluble in selected chemicals. This depolymerization allows the resist to be removed in the same or similar solution used for developing, as opposed to the aggressive chemicals typically used for stripping. For example, conventional stripping solutions frequently employ solutions made from butyl acetate, concentrated hydroxides, glycol ethers and/or amines. These chemicals are harmful to the plastics typically used in flexible displays, pose disposal problems, and are environmentally damaging. Concentrated hydroxide strippers can also adversely affect the oxidation state of the metal oxide film, thus changing its conductivity and physical properties. When the photoresist pattern 20 is removed or dissolved by the developing solution (typically the same solution that was used for the initial development step, for example, dilute hydroxide solutions), those portions of the metal oxide layer 32 that lie over the photoresist pattern 20 are carried away with the resist, leaving only the pattern 22 that is now defined in the metal oxide layer 32.

Figure 5:
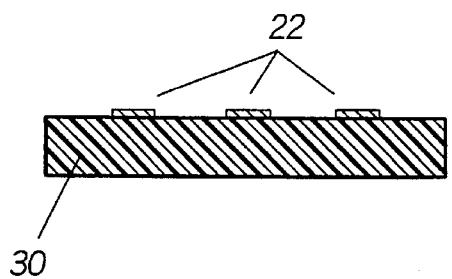

As can now be readily understood, the metal oxide layer does not need to be removed by techniques such as etching in strong acids or bases. As shown in FIGS. 4 and 5, the deposited metal oxide layer 32 is now a discontinuous layer forming the desired electrode pattern 22. This technique also does not require an extra step of removing the resist layer, as in the prior art. Having reviewed the process of the present invention, the reader will now appreciate that high quality, high resolution metal oxide layers, such as indium-tin oxide, can be formed on substrates to provide an electrode pattern. The process of the instant invention solves the problems currently encountered when using lift-off techniques. The use of harsh acids, bases or organic strippers is not required, thus allowing a wider range of materials to be used as substrates.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A lift-off method for forming electrode patterns on a substrate, comprising the steps of:
   a) providing a substrate having a patterned layer of positive photoresist on a top side and having portions of the substrate top side revealed;
   b) depositing a transparent coating layer on the patterned photoresist layer and the revealed portions of the substrate;
   c) exposing the patterned photoresist layer to actinic radiation through the transparent coating layer; and
   d) removing the exposed photoresist layer and those portions of the coating layer deposited on the photoresist layer, to form an electrode pattern by a lift-off technique.

2. The method as described in claim 1, wherein the coating is a metal oxide.

3. The method as described in claim 2, wherein the coating is deposited by sputtering.

4. The method as described in claim 3, wherein the substrate is plastic.

5. A lift-off method for forming electrode patterns on a substrate, comprising the steps of:
   a) providing a substrate having a patterned layer of positive photoresist deposited thereon, the patterned photoresist layer revealing portions of the substrate;
   b) sputtering a transparent indium-tin oxide layer on the patterned photoresist layer and the revealed portions of the substrate;
   c) flood exposing the patterned photoresist layer to ultraviolet light through the transparent indium-tin oxide layer; and
   d) removing the exposed photoresist layer in a solution of a dilute hydroxide, and leaving portions of the indium-tin oxide layer to form an electrode pattern on the substrate by a lift-off technique.

6. The method as described in claim 5, wherein the substrate is polyester, polyethersulfone, polycarbonate, or polyetherimide.

7. A method of patterning transparent, electrically conductive layers on a substrate, comprising the steps of:
   a) providing a substrate having a front side and a back side, and having a positive photoresist layer on the front side;
   b) exposing selected portions of the photoresist layer to ultraviolet light;
   c) developing the exposed photoresist layer to reveal portions of the substrate;
   d) sputtering a transparent coating on the developed photoresist layer and the revealed portions of the substrate;
   e) after step (d), flood exposing the photoresist layer to ultraviolet light through the transparent coating; and
   f) after step (e), removing the photoresist layer, and removing portions of the transparent coating to form an electrode pattern by a lift-off technique.

8. The method as described in claim 7, wherein the transparent coating is a metal oxide.

9. The method as described in claim 8, wherein the substrate is polyester, polyethersulfone, polycarbonate, or polyetherimide.

10. The method as described in claim 9, wherein step (c) is performed in a dilute hydroxide solution.

11. The method as described in claim 9, wherein step (e)

is performed in a dilute hydroxide solution.

12. The method as described in claim 9, wherein steps (c) and (d) are both performed in a solution of the same composition.

* * * * *